United States Patent [19]
Lin et al.

[11] Patent Number: 6,057,596
[45] Date of Patent: May 2, 2000

[54] CHIP CARRIER HAVING A SPECIFIC POWER JOIN DISTRIBUTION STRUCTURE

[75] Inventors: Wei-Feng Lin; Tony H. Ho, both of Hsinchu, Taiwan

[73] Assignee: Silicon Integrated Systems Corp., Hsinchu, Taiwan

[21] Appl. No.: 09/175,113

[22] Filed: Oct. 19, 1998

[51] Int. Cl.[7] .................................................. H01L 23/48
[52] U.S. Cl. ............................ 257/697; 257/738; 257/786
[58] Field of Search .................................... 257/738, 697, 257/786

[56] References Cited

U.S. PATENT DOCUMENTS

| | | | |
|---|---|---|---|
| 4,746,966 | 5/1988 | Fitzgerald et al. | 257/738 |
| 5,632,631 | 5/1997 | Fjelstad et al. | 439/82 |
| 5,641,988 | 6/1997 | Huang et al. | 257/697 |
| 5,796,169 | 8/1998 | Dockerty et al. | 257/738 |
| 5,895,968 | 4/1999 | Barber | 257/692 |

*Primary Examiner*—David Hardy
*Attorney, Agent, or Firm*—Alston & Bird LLP

[57] ABSTRACT

A chip carrier for carrying a chip is disclosed. The chip carrier includes a substrate having a first surface for mounting therein the chip wherein the substrate has a plurality of through holes and a plurality of conducting lines, a plurality of grounded joints set at a corresponding position of a second surface of the substrate under the chip and electrically connected to the chip by the plurality of conducting lines through the plurality of through holes for grounding, a plurality of signal joints surrounding the plurality of grounded joints on the second surface of the substrate and electrically connected to the chip by the plurality of conducting lines through the plurality of through holes for transmitting a series of signals, and a plurality of power joints set between the grounded joints and the signal joints and electrically connected to the chip by the plurality of conducting lines through the plurality of through holes for energizing the chip wherein there exists spaces among the ground joints, the signal joints, and the power joints.

19 Claims, 5 Drawing Sheets

CHIP CARRIER HAVING A SPECIFIC POWER JOIN DISTRIBUTION STRUCTURE

FIELD OF THE INVENTION

The present invention is related to a chip carrier, and especially to a chip carrier supporting multiple functions of high speed CPU and chip set.

BACKGROUND OF THE INVENTION

Generally, the conventional chip carriers have improper joints. Please refer to FIG. 1 which is a sectional view of a conventional chip carrier with a ball grid array (BGA) substrate. There are a chip 11 disposed on one side of the substrate 13 and packaged by a case 1. A plurality of balls are disposed on the other side of the substrate 13. FIG. 2 shows one kind of the conventional chip carrier in which the grounded balls 21 are disposed on the central area of the substrate 24. The power balls 22 and the signal balls 23 indiscriminately surround outside the grounded ball 21 by a space. With this messy layout of the power balls 22 and the signal balls 23, the conducting lines for connecting these balls to the chip on the first side of the substrate 24 are long and ineffective. Besides, the long conducting lines will cause a high resistance/inductance/capacitance (R/L/C) value which is very harmful to the transmission of signals.

FIG. 3 shows another kind of the conventional chip carrier with a BGA substrate. The grounded balls 31 and the power balls 32 are disposed on the central area of one side of the substrate 34 and the signal balls 33 surround them. Both of the grounded balls 31 and the power balls 32 are disposed a on half of the central area right under the chip on the other side, respectively. When the chip is under the operating condition, a great amount of heat will be generated from the chip, resulting in that the power balls 32 for energizing the chip are not workable under high temperature. This thermal effect may make the chip out of function. Moreover, because of the grounded balls, power balls, and signal balls are located together, there is a big chance to make the different balls touch each other under improper treatment the chip carrier. In these two kinds of BGA substrate of a chip carrier, it is an uneasy task to manufacture different balls in the same area when the space between each ball is getting smaller and smaller. If any two of the different balls touch each other, there will be a short-circuit generated in the chip.

SUMMARY OF THE INVENTION

An object of the present invention is to provide a chip carrier which can reduce the R/L/C value and increase the reliability.

According to the present invention, the chip carrier for carrying a chip includes a substrate having a first surface for mounting therein the chip wherein the substrate has a plurality of through holes and a plurality of conducting lines, a plurality of grounded joints set at a corresponding position of a second surface of the substrate under the chip and electrically connected to the chip by the plurality of conducting lines through the plurality of through holes for grounding, a plurality of signal joints surrounding the plurality of grounded joints on the second surface of the substrate and electrically connected to the chip by the plurality of conducting lines through the plurality of through holes for transmitting a series of signals, and a plurality of power joints set between the grounded joints and the signal joints and electrically connected to the chip by the plurality of conducting lines through the plurality of through holes for energizing the chip wherein there exists spaces among the ground joints, the signal joints and the power joints.

Preferably, the substrate further includes a power ring surrounding the chip on the first surface corresponding to the plurality of power joints set on the second surface of the substrate.

In accordance with one aspect of the present invention, the substrate is a ball grid array (BGA) substrate or a pin grid array (PGA) substrate. Preferably, the grounded joints, the signal joints, and the power joints are grounded balls, signal balls, and power balls respectively. Alternatively, these three kinds of joints are grounded pins, signal pins, and power pins respectively. These three kinds of the balls have a specific ball pitch and the space between the grounded balls and the power balls has a width ranged from one to three times of the specific ball pitch. The specific ball pitch is 1.27 mm, 1.0 mm or less than 1.0 mm. Moreover, the substrate is a two-layer substrate, a four-layer substrate or an even-layer substrate.

The present invention may best be understood through the following description with reference to the accompanying drawings, in which:

DETAILED DESCRIPTION OF THE PREFERRED EMBODIMENTS

Figure 1:
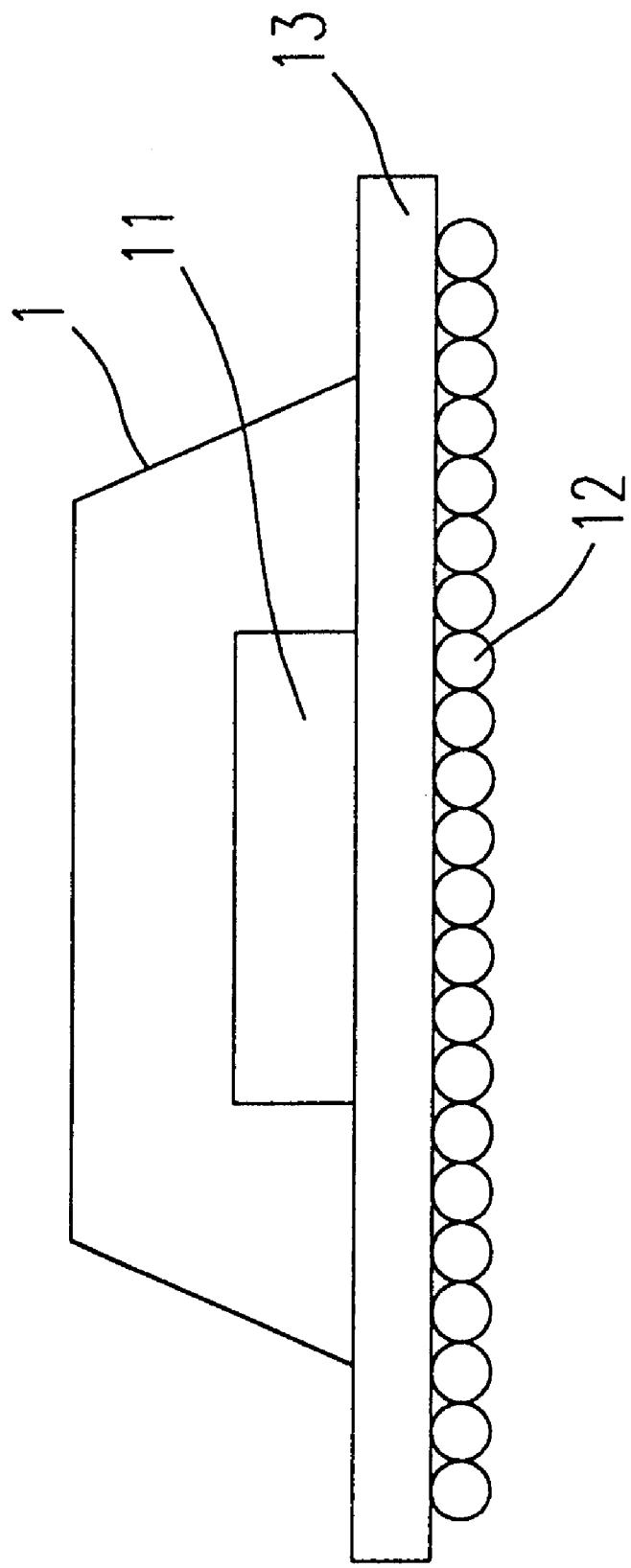
FIG. 1 is a sectional view of a chip carrier with a ball grid array (BGA) substrate.
Figure 2:
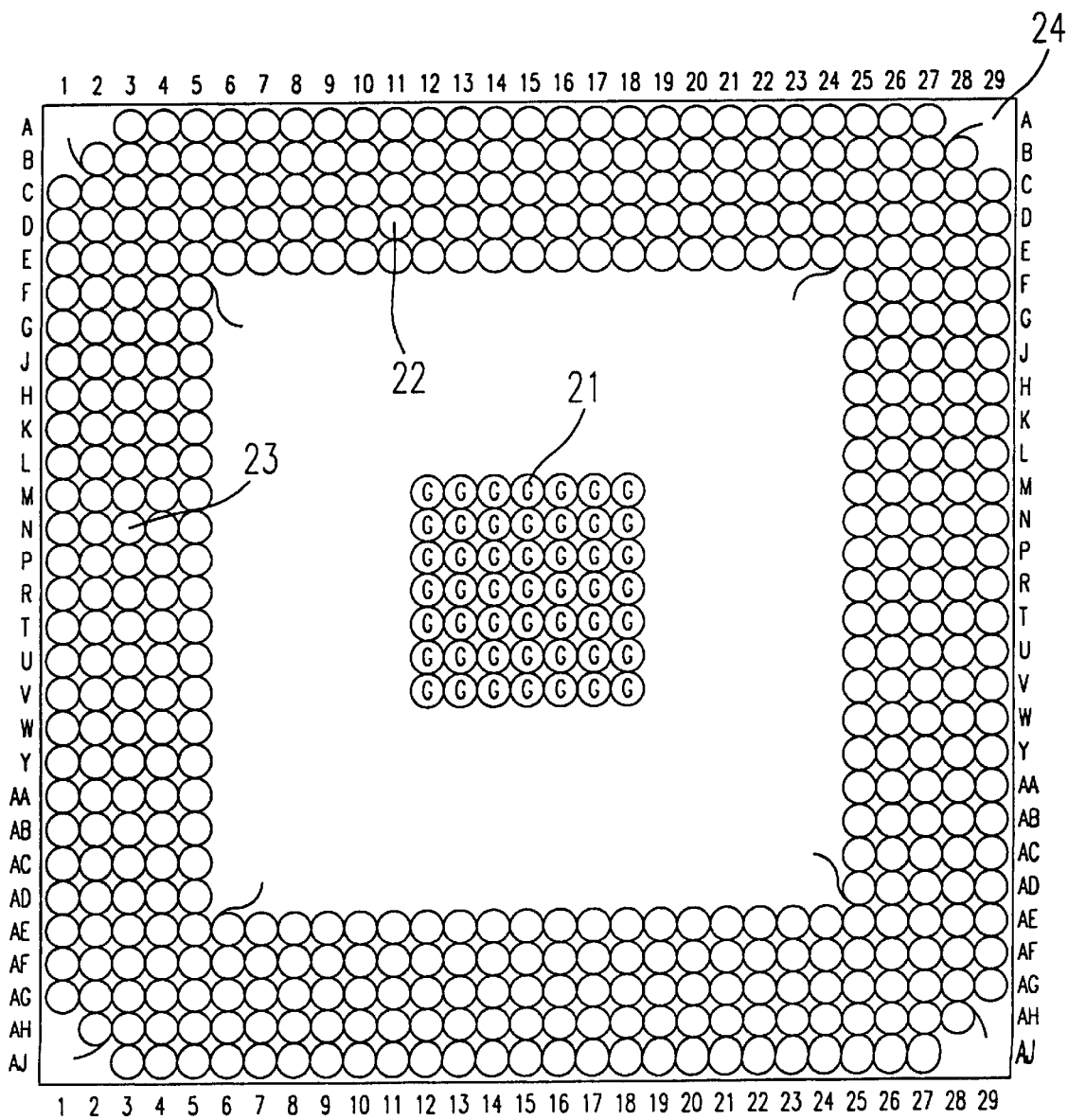
FIG. 2 is a schematic diagram showing a conventional chip carrier with a BGA substrate.
Figure 3:
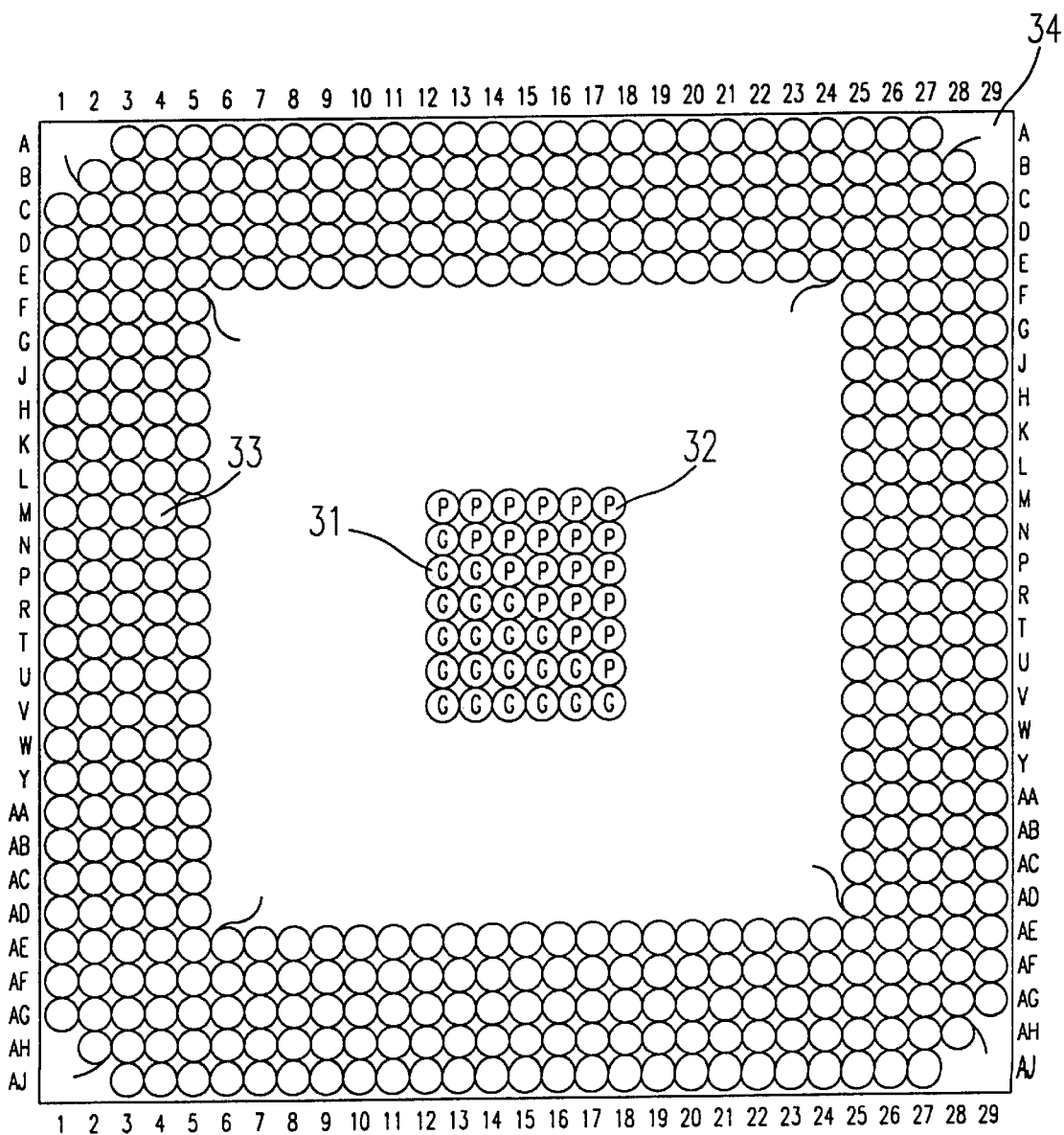
FIG. 3 is a schematic diagram showing another conventional chip carrier with a BGA substrate.
Figure 4:
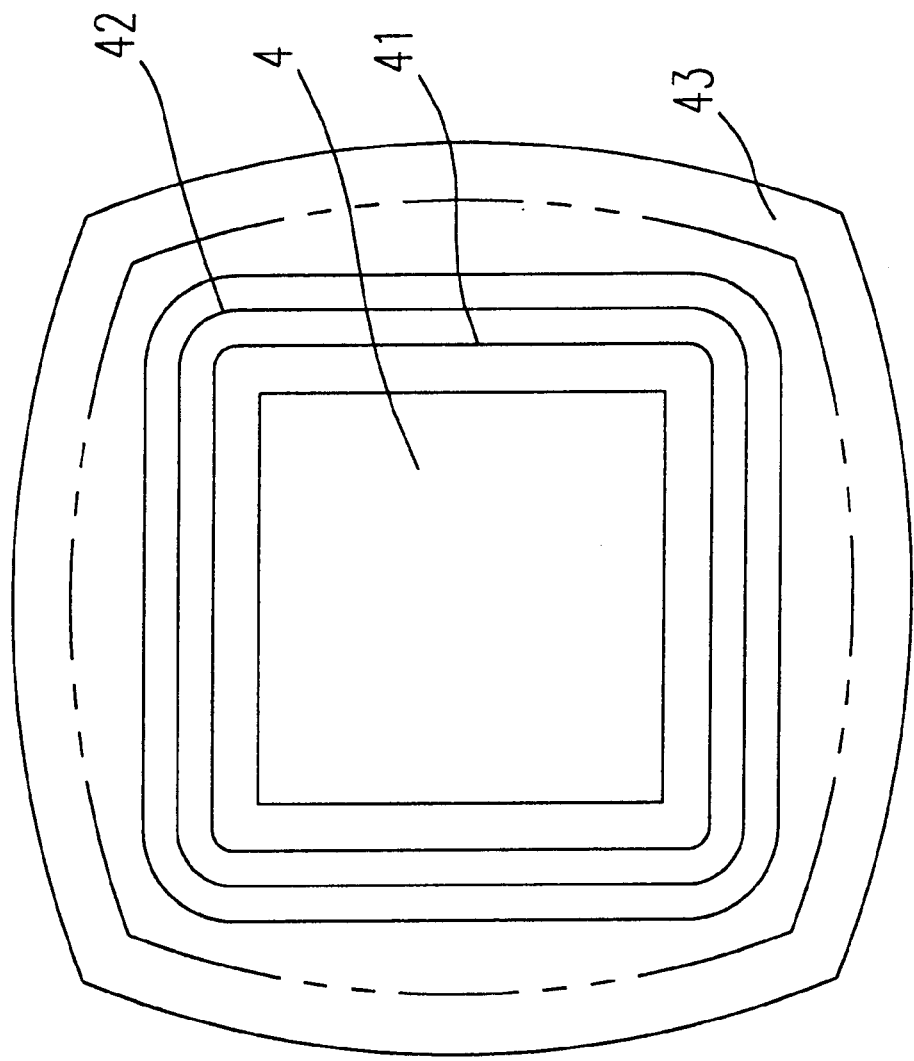
FIG. 4 is a top view of a preferred embodiment of a chip carrier according to the present invention.

Please refer to FIG. 4 which is a top view of a chip carrier according to the present invention. A chip 4 is disposed on the center of the first side of the substrate of a chip carrier. The grounded ring 41 surrounds the chip 4 by a space and two power rings 42 surround the grounded ring 41 by another space. The rings are used for connecting the chip to the joints one the second side. The length of the conducting lines is an important factor which will influence the resistance/inductance/capacitance (R/L/C) value.

Figure 5:
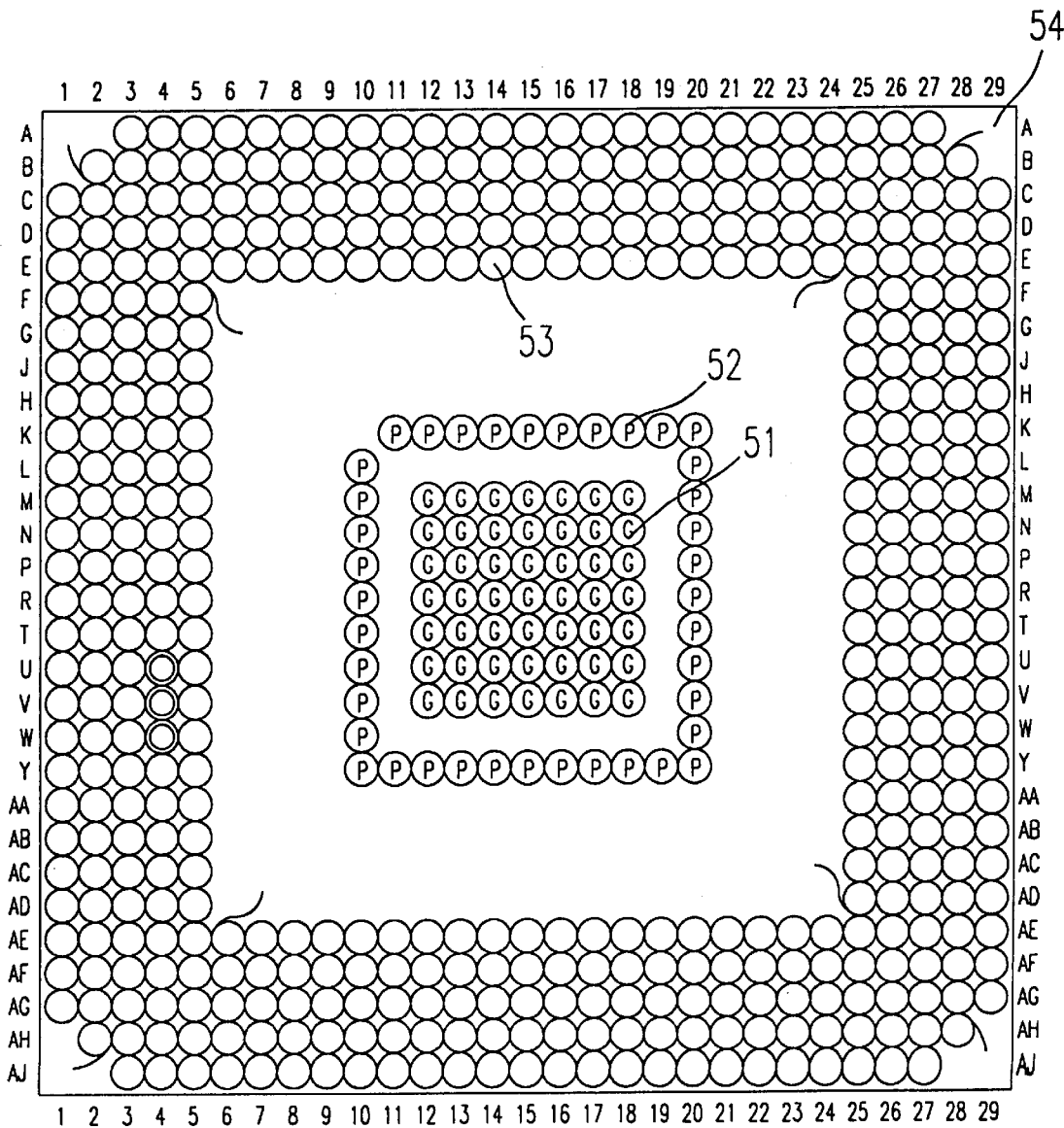
FIG. 5 is a schematic diagram showing the preferred embodiment of a chip carrier with a BGA substrate according to the present invention.

Please refer to FIG. 5 showing a preferred embodiment of a chip carrier according to the present invention. There are three kinds of joints: grounded balls 51, power balls 52, and signal balls 53. All of these balls have the same ball pitch. The grounded balls 51 are set in the central area of the second side of the chip carrier. The grounded balls 51 is right under the range within the grounded ring on the first side. The grounded balls 51 are connected with the grounded ring by the conducting lines through a plurality of through holes on the substrate. The power balls 52 surround with the grounded balls 51 by a specific space and are set right under the range within the two power rings on the first side. The power balls 52 are connected with the power rings by the conducting lines through a plurality of through holes on the substrate. The signal balls 53 surround outside the power balls 52 by another space. The space between the grounded balls 51 and the power balls 52 is ranged from one to three times of the ball pitch of balls and the ball pitch of the balls could be changed for different kinds of chips, depending on the package size. Usually, the ball pitchs of these three kinds of balls are 1.27 mm, 1.0 mm, or less than 1.0 mm.

According to the present invention, the power balls are not right under the chip so that the thermal effect cannot influence the power balls and the chip can have a better reliability. Besides, all of these balls right under their own rings can shorten the conducting line. Therefore, the R/L/C value can be minimized. By lowering the R/L/C value and shortening the length of conducting lines, the present invention can improve the reliability, and conducting efficiency of a chip.

Although the preferred embodiment is a chip carrier with a BGA substrate, the present invention can also be applied to a chip carrier with a pin grid array (PGA) substrate, depending on the applications of different joints. In addition, the substrate can also be a two-layer, a four-layer, or any even-layer substrate depending on the desired number of layers.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A chip carrier for carrying a chip comprising:
   an even layer substrate having a first surface for mounting therein said chip wherein said substrate has a plurality of through holes and a plurality of conducting lines;
   a plurality of grounded joints set at a corresponding position of a second surface of said substrate under said chip and electrically connected to said chip by said plurality of conducting lines through said plurality of through holes for grounding;
   a plurality of signal joints surrounding said plurality of grounded joints on said second surface of said substrate and electrically connected to said chip by said plurality of conducting lines through said plurality of through holes for transmitting a series of signals; and
   a plurality of power joints set between said grounded joints and said signal joints and electrically connected to said chip by said plurality of conducting lines through said plurality of through holes for energizing said chip wherein there exists spaces among said ground joints, said signal joints, and said power joints.

2. The chip carrier according to claim 1 wherein said substrate further comprises a power ring surrounding said chip on said first surface corresponding to said plurality of power joints set on said second surface of said substrate.

3. The chip carrier according to claim 1 wherein said substrate is a ball grid array (BGA) substrate.

4. The chip carrier according to claim 3 wherein said grounded joints, said signal joints, and said power joints are grounded balls, signal balls, and power balls respectively.

5. The chip carrier according to claim 4 wherein said balls have a specific ball pitch.

6. The chip carrier according to claim 5 wherein said space between said grounded balls and said power balls has a width ranged from one to three times of said specific ball pitch.

7. The chip carrier according to claim 5 wherein said space between said grounded joints and said power joints has a width equal to said specific ball pitch.

8. The chip carrier according to claim 5 wherein said specific ball pitch is 1.27 mm.

9. The chip carrier according to claim 5 wherein said specific ball pitch is 1.0 mm.

10. The chip carrier according to claim 5 wherein said specific ball pitch is less than 1.0 mm.

11. The chip carrier according to claim 1 wherein said substrate is a two-layer substrate.

12. The chip carrier according to claim 1 wherein said substrate is a four-layer substrate.

13. The chip carrier according to claim 1 wherein said substrate is a pin grid array (PGA) substrate.

14. The chip carrier according to claim 13 wherein said grounded joints, said signal joints, and said power joints are grounded pins, signal pins, and power pins respectively.

15. A chip carrier for carrying a chip comprising:
    a BGA substrate having a first surface for mounting therein said chip wherein said substrate has a plurality of through holes and a plurality of conducting lines;
    a plurality of grounded balls set at a corresponding position of a second surface of said substrate under said chip and electrically connected to said chip by said plurality of conducting lines through said plurality of through holes for grounding;
    a plurality of signal balls surrounding said plurality of grounded balls on said second surface of said substrate and electrically connected to said chip by said plurality of conducting lines through said plurality of through holes for transmitting a series of signals; and
    a plurality of power balls set between said grounded balls and said signal balls and electrically connected to said chip by said plurality of conducting lines through said plurality of through holes for energizing said chip wherein there exists spaces among said ground balls, said signal balls, and said power balls,
    wherein all of said balls have a specific ball pitch, and said space between said grounded balls and said power balls has a width ranged from one to three times of said specific ball pitch.

16. The chip carrier according to claim 15, wherein said specific ball pitch is 1.27 mm.

17. The chip carrier according to claim 15, wherein said specific ball pitch is 1.0 mm.

18. The chip carrier according to claim 15, wherein said BGA substrate is a two layer BGA substrate.

19. The chip carrier according to claim 15, wherein said BGA substrate is a four layer BGA substrate.

* * * * *